United States Patent
Lin et al.

(10) Patent No.: US 11,321,232 B2
(45) Date of Patent: May 3, 2022

(54) METHOD FOR SIMULTANEOUSLY ACCESSING FIRST DRAM DEVICE AND SECOND DRAM DEVICE AND ASSOCIATED MEMORY CONTROLLER

(71) Applicant: Realtek Semiconductor Corp., HsinChu (TW)

(72) Inventors: Wen-Wei Lin, Hsinchu County (TW); Kuan-Chia Huang, New Taipei (TW); Ching-Sheng Cheng, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 97 days.

(21) Appl. No.: 16/856,059

(22) Filed: Apr. 23, 2020

(65) Prior Publication Data

US 2020/0364142 A1  Nov. 19, 2020

(30) Foreign Application Priority Data

May 15, 2019 (TW) .................................. 108116747

(51) Int. Cl.
*G11C 11/408* (2006.01)
*G06F 12/06* (2006.01)

(52) U.S. Cl.
CPC ........ *G06F 12/0615* (2013.01); *G11C 11/408* (2013.01); *G06F 2212/1041* (2013.01)

(58) Field of Classification Search
CPC .......................... G06F 12/0615; G11C 11/408
See application file for complete search history.

(56) References Cited

U.S. PATENT DOCUMENTS

| | | | | |
|---|---|---|---|---|
| 6,016,537 A | * | 1/2000 | Hansen | ................... G06F 12/06 711/211 |
| 6,260,101 B1 | * | 7/2001 | Hansen | ................... G06F 9/342 710/22 |
| 2014/0160876 A1 | * | 6/2014 | Gupta | ................. G06F 12/0207 365/238.5 |
| 2017/0249991 A1 | * | 8/2017 | Han | ........................ G11C 5/141 |
| 2019/0324686 A1 | * | 10/2019 | Matulik | ................ G06F 3/0604 |

* cited by examiner

*Primary Examiner* — Tracy A Warren
(74) *Attorney, Agent, or Firm* — Winston Hsu

(57) ABSTRACT

A method for simultaneously accessing a first DRAM device and a second DRAM device includes the steps of: in an active phase, generating a first signal at a first pad, wherein the first signal is provided for the first DRAM device to select a first memory bank group, and the first signal is not for the second DRAM device to select any memory bank group; and generating a second signal at the first pad, wherein the second signal is provided for the first DRAM device to select the first bank group, and the second signal and the first signal correspond to a same digital value.

20 Claims, 6 Drawing Sheets

METHOD FOR SIMULTANEOUSLY ACCESSING FIRST DRAM DEVICE AND SECOND DRAM DEVICE AND ASSOCIATED MEMORY CONTROLLER

BACKGROUND OF THE INVENTION

1. Field of the Invention

The present invention relates to a memory device, more particularly, to a dynamic random access memory (DRAM).

2. Description of the Prior Art

In order to achieve the bit-width extension requirement, a memory controller is usually connected to a plurality of DRAM devices for accessing the DRAM devices in response to one access command. Generally, considering the consistence of the control command, the DRAM device coupled to the same memory controller will have the same bit-width and the same number of memory banks. For example, one memory controller may be coupled to two 16-bit output DRAM devices to achieve an output bit-width of 32-bit, but it cannot be applied to the DRAM devices with different output bit-width and different number of memory banks. For example, for a Double-Data-Rate Fourth Generation Synchronous DRAM (DDR4 SDRAM), the DRAM devices having 8-bit output bit-width have four memory bank groups and total 16 memory banks, and the DRAM devices having 16-bit output bit-width have two memory bank groups and total 8 memory banks. Therefore, besides the problem of controlling the memory bank group, the timing parameter limitation when switching each memory bank group is also a problem to the memory controller. With this regard, the memory controller basically cannot access the DRAM devices having 8-bit output bit-width and the DRAM devices having 16-bit output bit-width at the same time by using the same control command.

As discussed above, since the DRAM devices coupled to the same memory controller should have the same output bit-width, there is a lack of flexibility in the design of components and packages, which leads to design difficulties.

SUMMARY OF THE INVENTION

With this in mind, it is one object of the present invention to provide a novel DRAM design, which allows one memory controller being able to be coupled to a plurality of DRAM devices having different output bit-width and different number of memory banks. In this manner, the problem of lack of flexibility in the design of components and packages in conventional design can be solved.

According to one embodiment, a method for simultaneously accessing a first DRAM device and a second DRAM device comprises: in an active phase, generating a first signal at a first pad, wherein the first signal is provided for the first DRAM device to select a first memory bank group, and the first signal is not provided for the second DRAM device to select any memory bank group; and in an access phase, generating a second signal at the first pad, wherein the second signal is provided for the first DRAM device to select the first memory bank group, and the second signal and the first signal correspond to a same logical value.

According to another embodiment, a memory controller configured for simultaneously accessing a first DRAM device and a second DRAM device is provided. In an active phase, the memory controller is arranged to generate a first signal at a first pad, the first signal is provided for the first DRAM device to select a first memory bank group, and not provided for the second DRAM device to select any memory bank group. In an access phase, the memory controller is arranged to generate a second signal at the first pad, the second signal is provided for the first DRAM device to select the first memory bank group, and the second signal and the first signal correspond to a same logical value.

According to yet another embodiment, a memory controller configured for simultaneously accessing a first DRAM device and a second DRAM device is provided. A bank group signal provided by the memory controller for the first DRAM device is utilized as a portion of an address signal of the second DRAM device to achieve bit-width extension of the memory controller.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
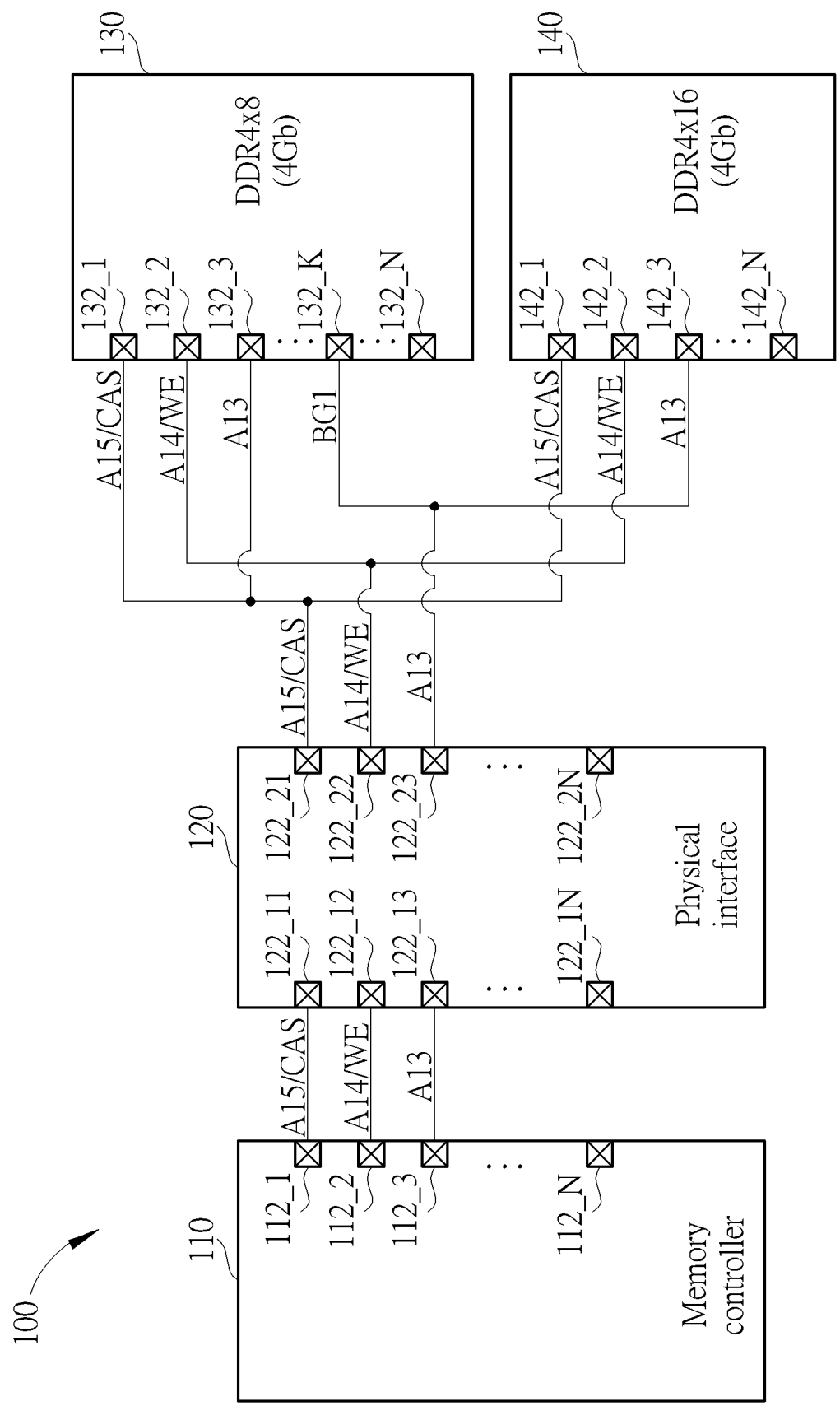
FIG. 1 is a schematic diagram of a memory device according to a first embodiment of the invention.

FIG. 1 is a schematic diagram of a memory device 100 according to a first embodiment of the invention. As shown in FIG. 1, the memory device 100 may comprise a memory controller 110, a physical interface 120, a first DRAM device 130 and a second DRAM device 140. The memory controller 110 may comprise a plurality of pads 112_1-112_N. The physical interface 120 may comprise a plurality of pads 122_11-122_1N connected to the memory controller 110 and a plurality of pads 122_21-122_2N connected to the first DRAM device 130 and the second DRAM device 140. The first DRAM device 130 may comprise a plurality of pads 132_1-132_N connected to the physical interface 120 and the second DRAM device 140 may comprise a plurality of pads 142_1-142_N connected to the physical interface 120. In this embodiment, the pads 112_1-112_3 of the memory controller 110 are arranged to transmit the address signals A15/CAS, A14/WE and A13 defined in the DDR4 standard, respectively. The pads 122_11-122_13 of the physical interface 120 are arranged to receive the address signals A15/CAS, A14/WE and A13, respectively, from the memory controller 110. After being serial/parallel converted, the address signals A15/CAS, A14/WE and A13 are transmitted to the pads 122_21-122_23. The pads 132_1-132_3 and 132_K of the first DRAM device 130 are arranged to receive the address signals A15/CAS, A14/WE and A13 and the bank group signal BG1 defined in the DDR4 standard. The pads 142_1-142_3 of the second DRAM device 140 are arranged to receive the address signals A15/CAS, A14/WE and A13. It should be noted that in FIG. 1, only the signals transmitted/received via the corresponding pads that are relevant to the invention are shown. For the functions of the remaining pads, reference may be made to the DDR4 standards, and the descriptions are omitted here for brevity.

In this embodiment, the first DRAM device 130 is the DRAM device having 8-bit output and a capacity of 4 Gb, and the second DRAM device 140 is the DRAM device having 16-bit output and a capacity of 4 Gb. In the DDR4 standard, the DRAM device with 8-bit output comprises 4 memory bank groups. Therefore, 2 pads are required to respectively receive the bank group signals BG0 and BG1 from the physical interface for selecting the memory bank group. In addition, the DRAM device with 16-bit output comprises only 2 memory bank groups. Therefore, only 1 pad is required to receive the bank group signal BG0 from the physical interface for selecting the memory bank group. As discussed above, since the first DRAM device 130 and the second DRAM device 140 have different numbers of memory bank groups, for the purpose that the memory controller 110 can simultaneously access the first DRAM device 130 and the second DRAM device 140 by using one set of control signals, the connections of the pads between the physical interface 120 and the first DRAM device 130 have been specially designed, such that the first DRAM device 130 and the second DRAM device 140 can be simultaneously accessed in compliance with the DDR4 standards.

To be more specific, since the DDR4 standard specifies that there is no need to use the address signals A17, A13 and A11 in the access phase of the second DRAM device 140 having 16-bit output, in the embodiments of the present invention, the pad 122_23 numbered as A13 of the physical interface 120 is connected to the pad 132_K numbered as BG1 of the first DRAM device 130 and the pad 142_3 numbered as A13 of the second DRAM device 140. In addition, the pad 122_22 numbered as A14/WE of the physical interface 120 is connected to the pad 132_2 numbered as A14/WE of the first DRAM device 130 and the pad 142_2 numbered as A14/WE of the second DRAM device 140. In addition, the pad 122_21 numbered as A15/CAS of the physical interface 120 is connected to the pad 132_1 numbered as A15/CAS of the first DRAM device 130, the pad 132_3 numbered as A13 of the first DRAM device 130 and the pad 142_1 numbered as A15/CAS of the second DRAM device 140. In this manner, the memory controller 110 is able to simultaneously access the first DRAM device 130 and the second DRAM device 140. It should be noted that the numbers A17, A13, A11, A14/WE, A15/CAS . . . etc. are the numbers specified in the DDR4 SDRAM standard.

In details, when the memory controller 110 has to access the first DRAM device 130 and the second DRAM device 140 at the same time, the operations may be divided into two phases, comprising the active phase and the access phase. In the active phase, the memory controller 110 may select a memory bank group of the first DRAM device 130 and activate one row of one memory bank in the selected memory bank group via the physical interface 120, and select a memory bank group of the second DRAM device 140 and activate one row of one memory bank in the selected memory bank group via the physical interface 120. For example, the address signal A13 generated at the pad 112_3 of the memory controller 110 is coupled to both the bank group signal BG1 required by the first memory DRAM device 130 and the address signal A13 required by the second DRAM device 140. That is, the address signal A13 generated by the memory controller 110 is provided for the first DRAM device 130 to use the address signal A13 together with another bank group signal BG0 (not shown in FIG. 1) to select a correct memory bank group, and the address signal A13 is also provided for the second DRAM device 140 to use the address signal A13 together with other address signal(s) to select the correct row address. On the other hand, since the address signal A13 generated by the memory controller 110 will not be transmitted to the pad 132_3 numbered as A13 of the first DRAM device 130, in order to make the space of the first DRAM device 130 to have a one-to-one mapping, through an internal mapping mechanism of the memory controller 110, the address signal A15/CAS output at the pad 112_1 is connected to the address signal A13 required by the first DRAM device 130 and the address signal A15/CAS required by the second DRAM device 140. That is, the address signal A15/CAS output by the memory controller 110 is provided for the first DRAM device 130 together with another address signal to select a correct row address (that is, the address signal A15/CAS output by the memory controller 110 can replace the original address signal A13 required by the first DRAM device 130). It should be noted that the first DRAM device 130 shown in FIG. 1 is the DRAM device having 8-bit output and a capacity of 4 Gb. In the DDR4 standard, it is mentioned that the address signals utilized by the DRAM device having 8-bit output and a capacity of 4 Gb are only A0-A14. Therefore, in this embodiment, utilizing the pad 132_1 numbered as A15/CAS to receive the original address signal A13 can facilitate the memory controller 110 to use the same set of signals to simultaneously control the first DRAM device 130 and the second DRAM device 140.

After operating in the active phase for a period of time, the memory controller 110 starts to operate in an access phase. In the access phase, the memory controller 110 is configured to select a memory bank group of the first DRAM device 130 through the physical interface 120 and activate one column of one memory bank in the selected memory bank group, and select a memory bank group of the second DRAM device 140 and activate one column of one memory bank in the selected memory bank group. The selected memory bank group is the same as the one selected in the active phase. For example, since the DDR4 standard specifies that there is no need to use the address signals A17, A13 and A11 in the access phase of the second DRAM device 140 having 16-bit output, the address signal A13 generated by the memory controller 110 in the active phase and the address signal A13 generated by the memory controller 110 in the access phase correspond to (have) the same logical value, so as to be provided for the first DRAM device 130 together with another bank group signal BG0 (not shown) to select the correct memory bank group. On the other hand, since the address signal A13 generated by the memory controller 110 will not be transmitted to the pad 132_3 numbered as A13 of the first DRAM device 130, for the first DRAM device 130 being able to select the correct column address, the memory controller 110 makes, through the internal mapping mechanism, the logical value of the address signal A15/CAS output at the pad 112_1 to coincide with the address signal A13 utilized by the first DRAM device 130 and the address signal A15/CAS utilized by the second DRAM device 140. That is, the address signal A15/CAS output by the memory controller 110 can be provided for the first DRAM device 130 to use the address signal together with another address signal to select a correct column address (that is, the address signal A15/CAS output by the memory controller 110 can replace the address signal A13 originally required by the first DRAM device 130).

As discussed above, via the proposed structure, the memory controller 110 can simultaneously access two memory devices having different numbers of memory bank groups without violating the DDR4 standards. In this manner, the flexibility of designing the memory device 100 can be improved.

It should be noted that in the embodiment shown in FIG. 1, the first DRAM device 130 uses the address signal A15/CAS output by the memory controller 110 to replace the address signal A13 that the first DRAM device 130 originally has to receive. However, the invention should not be limited thereto. As long as a signal received from the memory controller 110 and the physical interface 120 is not the one originally required by the first DRAM device 130, for example, the highest bit higher than the bits of an address signal required by first DRAM device 130, the first DRAM device 130 can use this signal output by the memory controller 110 to replace the address signal that is numbered as A13 and originally has to be received by the first DRAM device 130. For example, suppose that the first DRAM device 130 is the DRAM device having 8-bit output and a capacity of 2 Gb, since the it is mentioned in the DDR4 standards that the address signals have to be utilized by the DRAM device having 8-bit output and a capacity of 2 Gb are only A0-A13, through the internal mapping mechanism, the memory controller 110 can make the output address signal A14 to be able to be provided to the first DRAM device 130, for the first DRAM device 130 to use the address signal A14 together with another address signal to select a correct row/column address. Suppose that the first DRAM device 130 is the DRAM device having 8-bit output and a capacity of 8 Gb, since the it is mentioned in the DDR4 standards that the address signals have to be utilized by the DRAM device having 8-bit output and a capacity of 8 Gb are only A0-A15, through the internal mapping mechanism, the memory controller 110 can make the output address signal A16 to be able to be provided to the first DRAM device 130, for the first DRAM device 130 to use the address signal A16 together with another address signal to select a correct row/column address. Similarly, suppose that the first DRAM device 130 is the DRAM device having 8-bit output and a capacity of 16 Gb, since the it is mentioned in the DDR4 standards that the address signals have to be utilized by the DRAM device having 8-bit output and a capacity of 16 Gb are only A0-A16, through the internal mapping mechanism, the memory controller 110 can make the output address signal A17 to be able to be provided to the first DRAM device 130, for the first DRAM device 130 to use the address signal A17 together with another address signal to select a correct row/column address.

Figure 2:
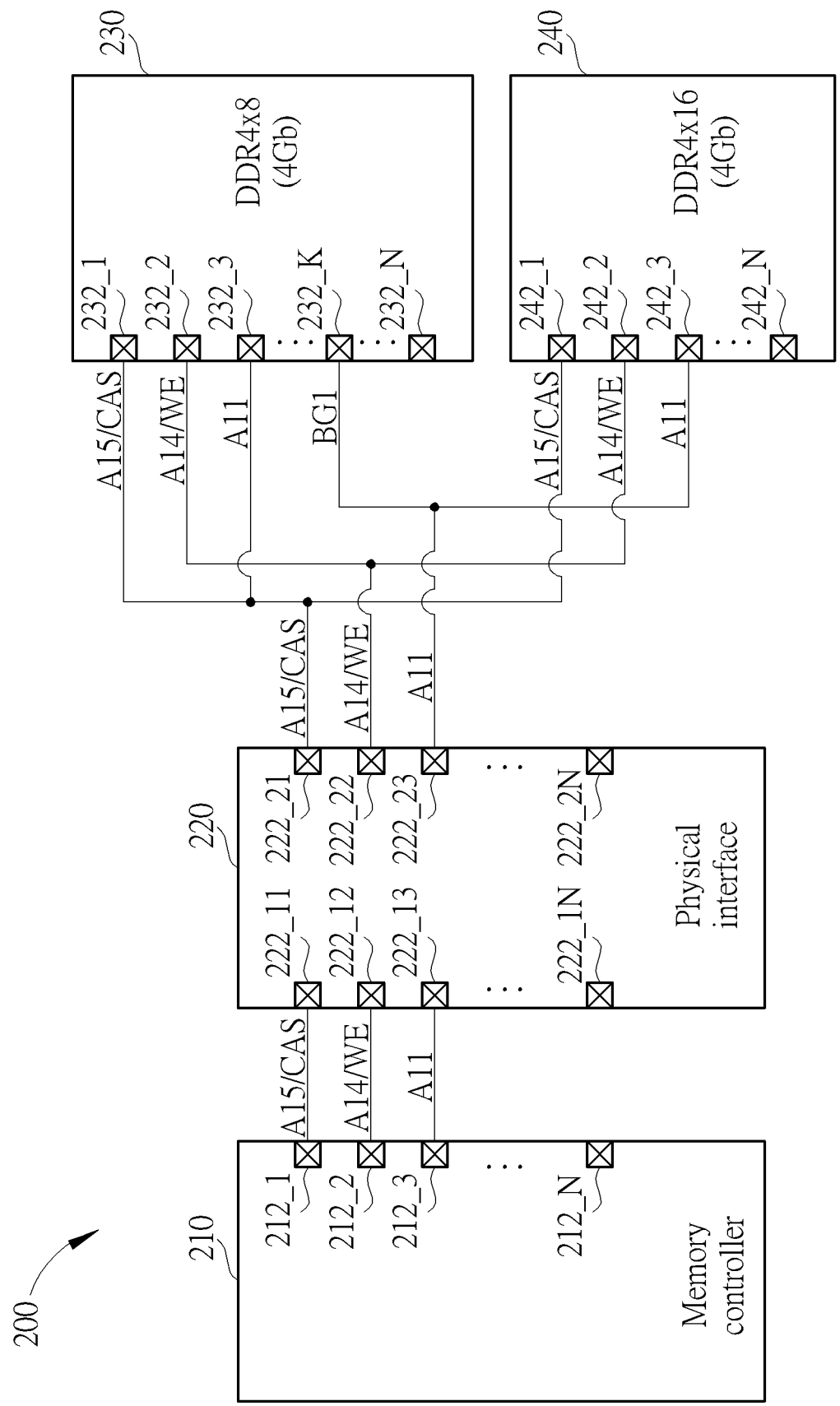
FIG. 2 is a schematic diagram of a memory device according to a second embodiment of the invention.

FIG. 2 is a schematic diagram of a memory device 200 according to a second embodiment of the invention. As shown in FIG. 2, the memory device 200 may comprise a memory controller 210, a physical interface 220, a first DRAM device 230 and a second DRAM device 240. The memory controller 210 may comprise a plurality of pads 212_1-212_N. The physical interface 220 may comprise a plurality of pads 222_11-222_1N connected to the memory controller 210 and a plurality of pads 222_21-222_2N connected to the first DRAM device 230 and the second DRAM device 240. The first DRAM device 230 may comprise a plurality of pads 232_1-232_N connected to the physical interface 220 and the second DRAM device 240 may comprise a plurality of pads 242_1-242_N connected to the physical interface 220. The structure of the memory device 200 is similar to that of the memory device 100 shown in FIG. 1, and the difference is only in that the A13 of the memory device 100 is replaced with A11. To be more specific, the pad 212_3 of the memory controller 210 is a pad having the number A11. The pad 222_23 of the physical interface 220 having the number A11 is connected to the pad 232_K having the number BG1 of the first DRAM device 230 and the pad 242_3 having the number A11 of the second DRAM device 240. The pad 222_22 of the physical interface 220 having the number A14/WE is connected to the pad 232_2 having the number A14/WE of the first DRAM device 230 and the pad 242_2 having the number A14/WE of the second DRAM device 240. The pad 222_21 of the physical interface 220 having the number A15/CAS is connected to the pad 232_1 having the number A15/CAS and the pad 232_3 having the number A11 of the first DRAM device 230 and the pad 242_1 having the number A15/CAS of the second DRAM device 240. In this manner, the memory controller 210 can simultaneously access the first DRAM device 230 and the second DRAM device 240. Since the person having ordinary skill in the art can easily understand the operations of the memory device 200 after reading the embodiments relating to the memory device 100 as illustrated above, details of the operations of the memory device 200 are omitted here for brevity.

Figure 3:
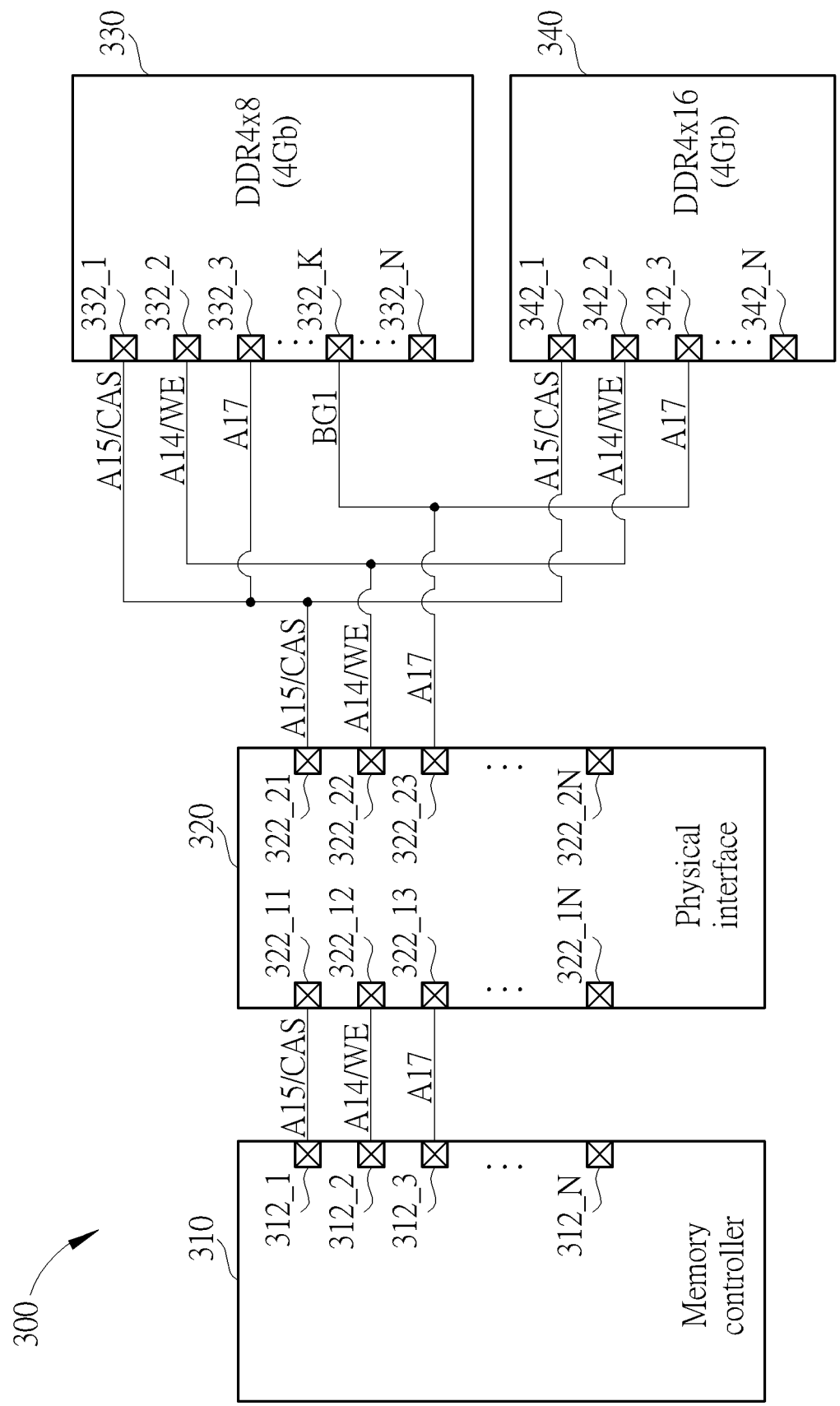
FIG. 3 is a schematic diagram of a memory device according to a third embodiment of the invention.

FIG. 3 is a schematic diagram of a memory device 300 according to a third embodiment of the invention. As shown in FIG. 3, the memory device 300 may comprise a memory controller 310, a physical interface 320, a first DRAM device 330 and a second DRAM device 340. The memory controller 310 may comprise a plurality of pads 312_1-312_N. The physical interface 320 may comprise a plurality of pads 322_11-322_1N connected to the memory controller 310 and a plurality of pads 322_21-322_2N connected to the first DRAM device 330 and the second DRAM device 340. The first DRAM device 330 may comprise a plurality of pads 332_1-332_N connected to the physical interface 320 and the second DRAM device 340 may comprise a plurality of pads 342_1-342_N connected to the physical interface 320. The structure of the memory device 300 is similar to that of the memory device 100 shown in FIG. 1, and the difference is only in that the A13 of the memory device 100 is replaced with A17. To be more specific, the pad 312_3 of the memory controller 310 is a pad corresponding to the number A17. The pad 322_23 of the physical interface 320 corresponding to the number A17 is connected to the pad 332_K of the first DRAM device 330 corresponding to the number BG1 and the pad 342_3 of the second DRAM device 340 corresponding to the number A17. The pad 322_22 of the physical interface 320 corresponding to the number A14/WE is connected to the pad 332_2 of the first DRAM device 330 corresponding to the number A14/WE and the pad 342_2 of the second DRAM device 340 corresponding to the number A14/WE. The pad 322_21 of the physical interface 320 corresponding to the number A15/CAS is connected to the pad 332_1 of the first DRAM device 330 corresponding to the number A15/CAS and the pad 332_3 of the first DRAM device 330 corresponding to the number A17 and the pad 342_1 having the number A15/CAS of the second DRAM device 340. In this manner, the memory controller 310 can simultaneously access the first DRAM device 330 and the second DRAM device 340. Since the person having ordinary skill in the art can easily understand the operations of the memory device 300 after reading the embodiments relating to the memory device 100 as illustrated above, details of the operations of the memory device 300 are omitted here for brevity.

Figure 4:
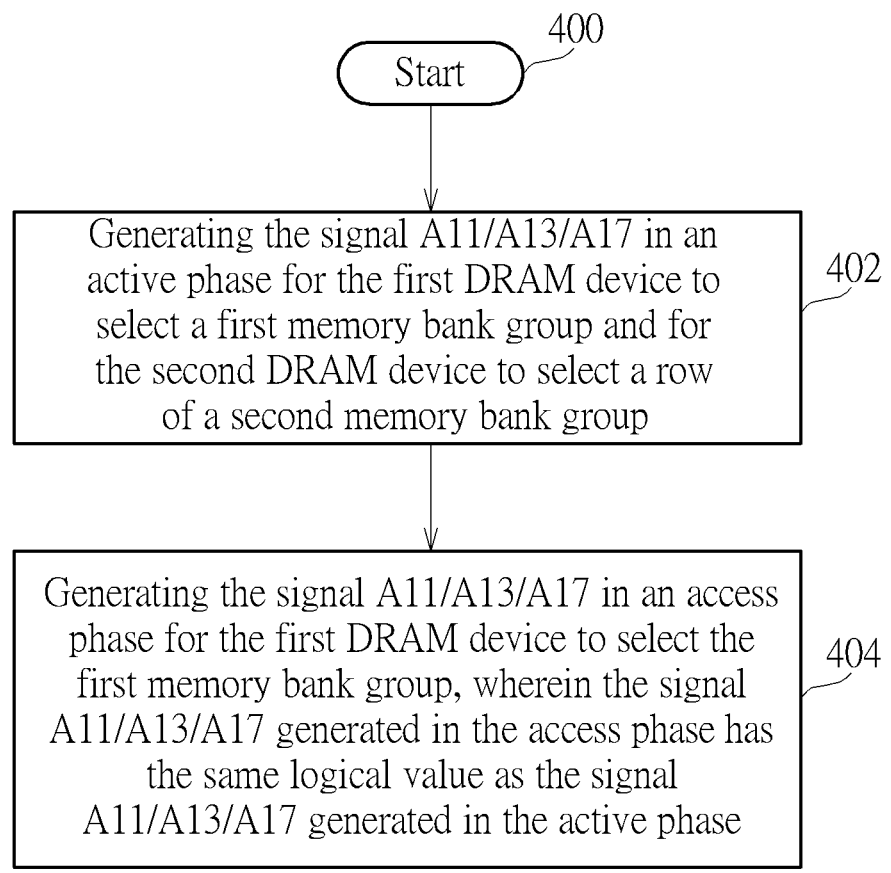
FIG. 4 is a flow chart of accessing a first DRAM device and a second DRAM device according to an embodiment of the invention.

FIG. 4 is a flow chart of accessing the first DRAM device 130 and the second DRAM device 140 according to an embodiment of the invention. Referring to the content shown in the embodiments of FIG. 1-FIG. 3, the flow is illustrated below:

Step 400: the flow is started.

Step 402: generating the signal A11/A13/A17 in an active phase for the first DRAM device to select a first memory bank group and for the second DRAM device to select a row of a second memory bank group.

Step 404: generating the signal A11/A13/A17 in an access phase for the first DRAM device to select the first memory bank group, wherein the signal A11/A13/A17 generated in the access phase has the same logical value as the signal A11/A13/A17 generated in the active phase.

In the afore-mentioned embodiments, when the memory controller 110/210/310 is regarded as a memory controller applied in a DRAM device having 16-bit output, the bank group signal BG1 provided by the memory controller 110/210/310 for a DRAM device having 4-bit or 8-bit output may be utilized as a portion of an address signal of the DRAM device having 16-bit output, so as to achieve bit-width extension function of the memory controller. In addition, the bank group signal BG1 provided by the memory controller 110/210/310 for the DRAM device having 4-bit or 8-bit output may be connected to or may share the signals A10-A17 of the DRAM device having 16-bit output or the row address logic signal comprised in the signals A10-A17. The memory controller 110/210/310 may additionally output the row address signal to the bank group signal BG1 of the DRAM device having 4-bit or 8-bit output when generating the writ/read command. In addition, according to the DDR4 standards, the afore-mentioned DRAM device having 4-bit or 8-bit output comprises 4 memory bank groups and the afore-mentioned DRAM device having 16-bit output comprises 2 memory bank groups.

On the other hand, when the memory controller 110/210/310 is regarded as a memory controller applied in a DRAM device having 4-bit or 8-bit output, the bank group signal BG1 provided by the memory controller 110/210/310 for a DRAM device having 4-bit or 8-bit output may be utilized as a portion of an address signal of the DRAM device having 16-bit output, so as to achieve bit-width extension function of the memory controller. The bank group signal BG1 provided by the memory controller 110/210/310 for the DRAM device having 4-bit or 8-bit output may be connected to the signals A10-A17 of the DRAM device having 16-bit output. The memory controller 110/210/310 is arranged to internally treat or recognize two bit combinations (0,0) and (1,0) of the two bank group signals BG0 and BG1 as directing to the same memory bank group, so as to avoid timing parameter check of the memory bank group, and treat or recognize the other two bit combinations (0,1) and (1,1) of the two bank group signals BG0 and BG1 as directing to the same memory bank group, so as to avoid timing parameter check of the memory bank group.

Figure 5:
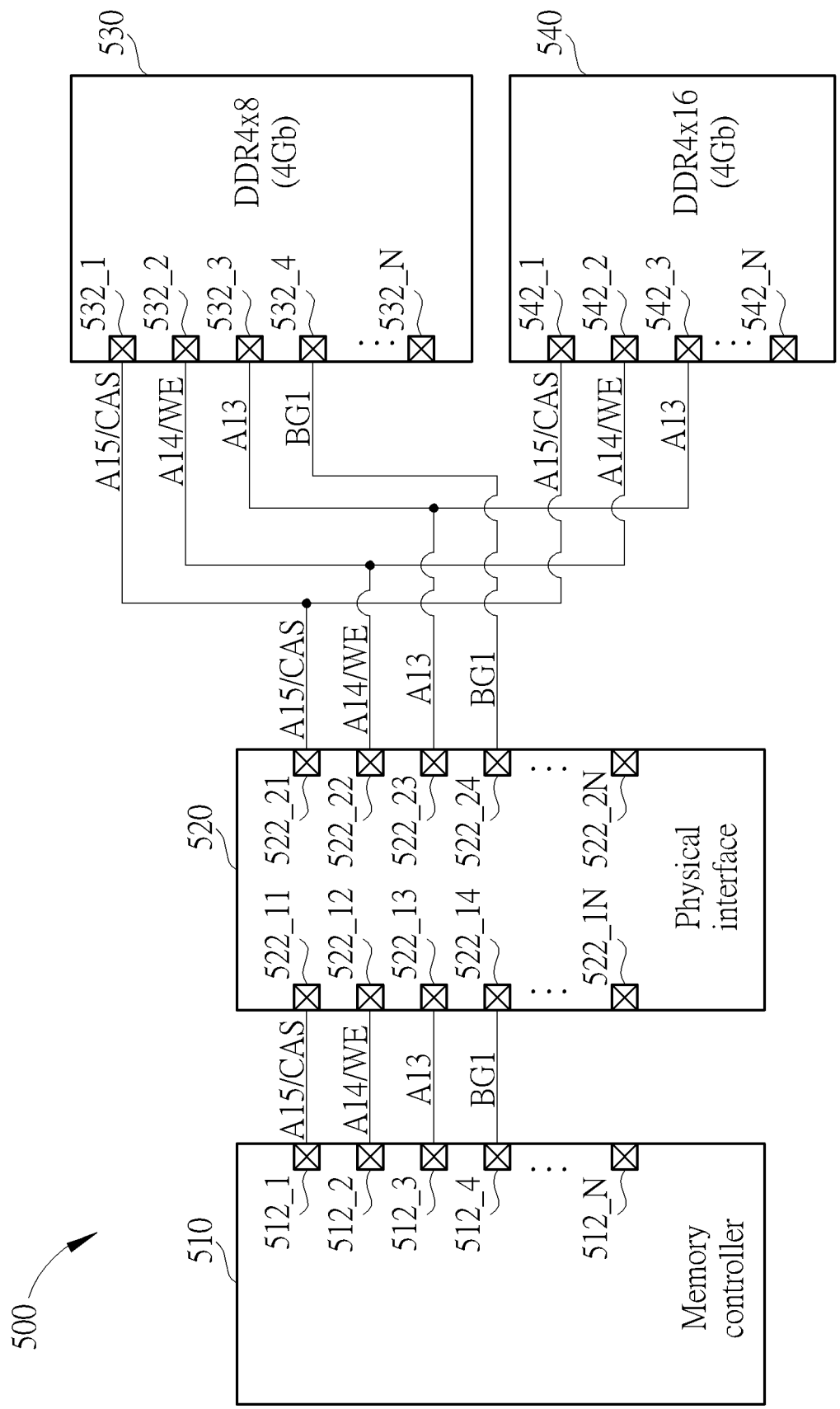
FIG. 5 is a schematic diagram of a memory device according to a fourth embodiment of the invention.

FIG. 5 is a schematic diagram of a memory device 500 according to a fourth embodiment of the invention. As shown in FIG. 5, the memory device 500 may comprise a memory controller 510, a physical interface 520, a first DRAM device 530 and a second DRAM device 540. The memory controller 510 may comprise a plurality of pads 512_1-512_N. The physical interface 520 may comprise a plurality of pads 522_11-522_1N connected to the memory controller 510 and a plurality of pads 522_21-522_2N connected to the first DRAM device 530 and/or the second DRAM device 540. The first DRAM device 530 may comprise a plurality of pads 532_1-532_N connected to the physical interface 520 and the second DRAM device 540 may comprise a plurality of pads 542_1-542_N connected to the physical interface 520. In this embodiment, the pads 512_1-512_4 of the memory controller 510 are arranged to respectively transmit the signals numbered as A15/CAS, A14/WE, A13 and BG1 as defined by the DDR4 standards. The pads 522_11-522_14 of the physical interface 520 are arranged to receive the signals numbered as A15/CAS, A14/WE, A13 and BG1 from the memory controller 510. After being serial/parallel converted, the signals A15/CAS, A14/WE, A13 and BG1 are transmitted to the pads 522_21-522_24. The pads 532_1-532_4 of the first DRAM device 530 are arranged to receive the signals numbered as A15/CAS, A14/WE, A13 and BG1 as defined by the DDR4 standards. The pads 542_1-542_3 of the second DRAM device 540 are arranged to receive the signals numbered as A15/CAS, A14/WE and A13 as defined by the DDR4 standards. It should be noted that in FIG. 5, only the signals transmitted/received via the corresponding pads that are relevant to the invention are shown. For the functions of the remaining pads, reference may be made to the DDR4 standard, and the descriptions are omitted here for brevity.

In this embodiment, the first DRAM device 530 is the DRAM device having 8-bit output and a capacity of 4 Gb, and the second DRAM device 540 is the DRAM device having 16-bit output and a capacity of 4 Gb. In the DDR4 standard, the DRAM device with 8-bit output comprises 4 memory bank groups. Therefore, 2 pads are required to respectively receive the bank group signals BG0 and BG1 from the physical interface for selecting the memory bank group. In addition, the DRAM device with 16-bit output comprises only 2 memory bank groups. Therefore, only 1 pad is required to receive the bank group signal BG0 from the physical interface for selecting the memory bank group. As discussed above, since the first DRAM device 530 and the second DRAM device 540 have different numbers of memory bank groups, for the purpose that the memory controller 510 can simultaneously access the first DRAM device 530 and the second DRAM device 640 by using one set of control signals, the bank group signal BG1 is additionally generated according to an internal signal of the first DRAM device 510 and provided solely for the first DRAM device 530 to use it, such that the first DRAM device 530 and the second DRAM device 540 can be simultaneously accessed in compliance with the DDR4 standards.

In details, when the memory controller 510 has to access the first DRAM device 530 and the second DRAM device 540 at the same time, the operations may be divided into two phases, comprising the active phase and the access phase. In the active phase, the memory controller 510 may select a memory bank group of the first DRAM device 530 and activate one row of one memory bank in the selected memory bank group via the physical interface 520, and select a memory bank group of the second DRAM device 140 and activate one row of one memory bank in the selected memory bank group via the physical interface 520.

To be more specific, through an internal mapping mechanism of the memory controller 510, the signal BG1 is output at the pad 512_4, and the signal BG1 is provided for the first DRAM device 530 together with another signal BG0 (not shown) to select a correct memory bank group. The bank group signal BG1 may be transmitted to the first DRAM device 530 via the unused pad of the first DRAM device 530. For example, the pad configured for the highest bit, which is higher than the bits required by the address signal, of the address signal. The memory controller 510 may also generate the bank group signal BG1 via the signal corresponding to the pad as discussed above.

For example, suppose that the first DRAM device 530 is the DRAM device having 8-bit output and a capacity of 4 Gb, since the it is mentioned in the DDR4 standards that the address signals utilized by the DRAM device having 8-bit output and a capacity of 4 Gb are only A0-A14, through the internal mapping mechanism, the memory controller 510 may generate the bank group signal BG1 according to the signal numbered as A15, where the signal number as A15 is utilized for the second DRAM device 540 to determine the row address. In addition, in other embodiment of the invention, suppose that the first DRAM device 530 is the DRAM device having 8-bit output and a capacity of 2 Gb, since the it is mentioned in the DDR4 standards that the address signals utilized by the DRAM device having 8-bit output and a capacity of 2 Gb are only A0-A13, through the internal mapping mechanism, the memory controller 510 may generate the bank group signal BG1 according to the signal numbered as A14. Similarly, suppose that the first DRAM device 530 is the DRAM device having 8-bit output and a capacity of 8 Gb, since the it is mentioned in the DDR4 standards that the address signals utilized by the DRAM device having 8-bit output and a capacity of 8 Gb are only A0-A15, through the internal mapping mechanism, the memory controller 510 may generate the bank group signal BG1 according to the signal numbered as A16. Similarly, suppose that the first DRAM device 530 is the DRAM device having 8-bit output and a capacity of 16 Gb, since the it is mentioned in the DDR4 standards that the address signals utilized by the DRAM device having 8-bit output and a capacity of 16 Gb are only A0-A16, through the internal mapping mechanism, the memory controller 510 may generate the bank group signal BG1 according to the signal numbered as A17.

After operating in the active phase for a period of time, the memory controller 510 starts to operate in an access phase. In the access phase, the memory controller 510 is configured to select a memory bank group of the first DRAM device 530 through the physical interface 520 and activate one column of one memory bank in the selected memory bank group, and select a memory bank group of the second DRAM device 540 and activate one column of one memory bank in the selected memory bank group. To be more specific, the bank group signal BG1 generated by the memory controller 510 in the active phase and the bank group signal BG1 generated by the memory controller 510 in the access phase correspond to (have) the same logical value, so as to be provided for the first DRAM device 530 together with another group signal BG0 (not shown) to select the correct memory bank group.

Figure 6:
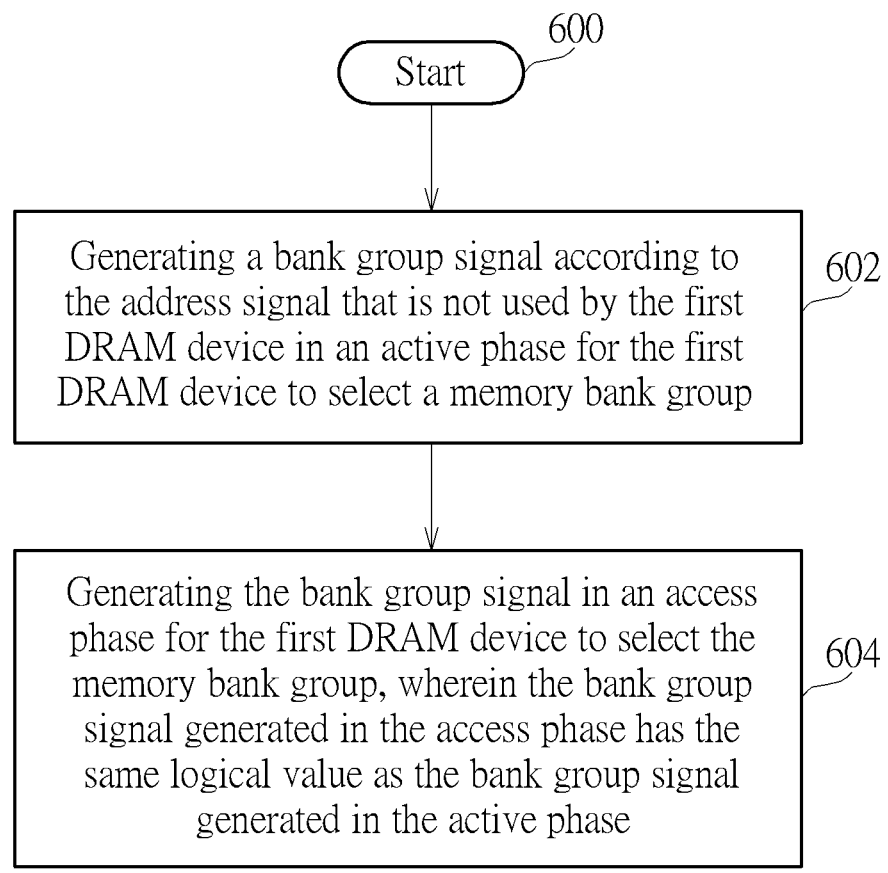
FIG. 6 is a flow chart of a method for accessing a first DRAM device and a second DRAM device according to another embodiment of the invention.

FIG. 6 is a flow chart of a method for accessing the first DRAM device 530 and a second DRAM device 540 according to an embodiment of the invention. Referring to the embodiment shown in FIG. 5, the flow is illustrated as below:

Step 600: the flow is started.

Step 602: generating a bank group signal according to the address signal that is not used by the first DRAM device in an active phase for the first DRAM device to select a memory bank group.

Step 604: generating the bank group signal in an access phase for the first DRAM device to select the memory bank group, wherein the bank group signal generated in the access phase has the same logical value as the bank group signal generated in the active phase.

It should be noted that although in the embodiments illustrated above, the first DRAM device 130/230/330/530 and the second DRAM device 140/240/340/540 are the DRAM device having 8-bit output and 16-bit output, such conditions are merely utilized for illustration and are not the limitations the invention. In other embodiment of the invention, as long as the number of memory bank groups of two DRAM devices are different, and number of bank group signals required by the first DRAM device is higher than that of the second DRAM device, the first DRAM device 130/230/330/530 and the second DRAM device 140/240/340/540 may both be replaced by the DRAM devices having other number of output bit, and those design variation should all be subject to the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for simultaneously accessing a first dynamic random access memory (DRAM) device and a second DRAM device comprising:
    in an active phase, generating a first signal at a first pad, wherein the first signal is provided for the first DRAM device to select a first memory bank group; and
    in an access phase, generating a second signal at the first pad, wherein the second signal is provided for the first DRAM device to select the first memory bank group, and the second signal and the first signal correspond to a same logical value;
    wherein the first DRAM device and the second DRAM device have different numbers of memory bank groups.

2. The method of claim 1, wherein the step of generating the first signal at the first pad in the active phase further comprises:
    providing the first signal to the first DRAM device and the second DRAM device, wherein the first signal is provided for the second DRAM device to determine a row of a second memory bank group.

3. The method of claim 2, wherein the second DRAM device does not perform any operation according to the second signal.

4. The method of claim 1, wherein the first pad is a pad numbered as A11, A13 or A17 in a Double-Data-Rate Fourth Generation Synchronous DRAM (DDR4 SDRAM) standard.

5. The method of claim 2, further comprising:
    in the active phase, generating a third signal at a second pad and providing the third signal to the first DRAM device and the second DRAM device, wherein the third signal is provided for the first DRAM device to select a row of the first memory bank group, the second pad corresponds to an address signal, and the address signal has different numbering for the first DRAM device and the second DRAM device.

6. The method of claim 5, wherein the first pad is a pad numbered as A11, A13 or A17 in a Double-Data-Rate Fourth Generation Synchronous DRAM (DDR4 SDRAM) standard, and the second pad is a pad numbered as A14, A15, A16 or A17 in the DDR4 SDRAM standard.

7. The method of claim 1, wherein the first DRAM device comprises four memory bank groups, and the second DRAM device comprises two memory bank groups.

8. The method of claim 1, wherein the second DRAM device does not perform any operation according to the first signal.

9. The method of claim 1, further comprising:
generating the first signal according to an address signal, wherein the address signal is utilized by the second DRAM device to determine a row of a second memory bank group, and the address signal is not utilized by the first DRAM device.

10. A memory controller configured for simultaneously accessing a first dynamic random access memory (DRAM) device and a second DRAM device, wherein in an active phase, the memory controller is arranged to generate a first signal at a first pad, the first signal is provided for the first DRAM device to select a first memory bank group; and in an access phase, the memory controller is arranged to generate a second signal at the first pad, the second signal is provided for the first DRAM device to select the first memory bank group, and the second signal and the first signal correspond to a same logical value, wherein the first DRAM device and the second DRAM device have different numbers of memory bank groups.

11. The memory controller of claim 10, wherein in the active phase, the memory controller is further arranged to provide the first signal to the first DRAM device and the second DRAM device, wherein the first signal is provided for the second DRAM device to determine a row of a second memory bank group.

12. The memory controller of claim 10, wherein the first pad is a pad numbered as A11, A13 or A17 in a Double-Data-Rate Fourth Generation Synchronous DRAM (DDR4 SDRAM) standard.

13. The memory controller of claim 11, wherein in the active phase, the memory controller is further arranged to generate a third signal at a second pad and provide the third signal to the first DRAM device and the second DRAM device, wherein the third signal is provided for the first DRAM device to select a row of the first memory bank group, the second pad corresponds to an address signal, and the address signal has different numbering for the first DRAM device and the second DRAM device.

14. The memory controller of claim 13, wherein the first pad is a pad numbered as A11, A13 or A17 in a Double-Data-Rate Fourth Generation Synchronous DRAM (DDR4 SDRAM) standard, and the second pad is a pad numbered as A14, A15, A16 or A17 in the DDR4 SDRAM standard.

15. The memory controller of claim 10, wherein the first DRAM device comprises four memory bank groups, and the second DRAM device comprises two memory bank groups.

16. A memory controller configured for simultaneously accessing a first DRAM device and a second DRAM device, wherein a bank group signal provided by the memory controller for the first DRAM device is utilized as a portion of an address signal of the second DRAM device to achieve bit-width extension of the memory controller, wherein the first DRAM device and the second DRAM device have different numbers of memory bank groups.

17. The memory controller of claim 16, wherein in an active phase, the memory controller is arranged to generate the address signal at a first pad, the address signal is provided for the first DRAM device to select a first memory bank group, and not provided for the second DRAM device to select any memory bank group; and in an access phase, the memory controller is arranged to generate the address signal at the first pad, the address signal is provided for the first DRAM device to select the first memory bank group, and the address signal generated in the active phase and the address signal generated in the access phase correspond to a same logical value.

18. The memory controller of claim 16, wherein the first DRAM device comprises four memory bank groups, and the second DRAM device comprises two memory bank groups.

19. The memory controller of claim 16, wherein when the memory controller generates a write/read command to the first DRAM device and the second DRAM device, the memory controller is arranged to additionally generate an address signal for the first DRAM device.

20. The memory controller of claim 16, wherein the memory controller is further arranged to generate two bank group signals to the first DRAM device, the two bank group signals comprises the bank group signal and have four bit combinations, and the memory controller is arranged to treat two bit combinations among the four bit combinations of the two bank group signals as directing to a first memory bank group, and treat the other two bit combinations among the four bit combinations of the two bank group signals as directing to a second memory bank group, to avoid timing parameter check of the memory bank group.

* * * * *